United States Patent [19]
Lee

[11] Patent Number: 6,060,132
[45] Date of Patent: May 9, 2000

[54] HIGH DENSITY PLASMA CVD PROCESS FOR MAKING DIELECTRIC ANTI-REFLECTIVE COATINGS

[75] Inventor: Gill Yong Lee, Fishkill, N.Y.

[73] Assignee: Siemens Aktiengesellschaft, Munich, Germany

[21] Appl. No.: 09/097,872

[22] Filed: Jun. 15, 1998

[51] Int. Cl.[7] .............................. H05H 1/24; C23C 16/30
[52] U.S. Cl. ...................... 427/579; 427/578; 427/167; 427/255.18; 427/255.37; 427/255.394
[58] Field of Search .................................... 427/579, 578, 427/569, 255.394, 255.37, 255.18, 167

[56] References Cited

U.S. PATENT DOCUMENTS

| | | | |
|---|---|---|---|
| 4,510,172 | 4/1985 | Ray | 427/38 |
| 4,927,704 | 5/1990 | Reed et al. | 428/221 |
| 5,013,690 | 5/1991 | Hochberg et al. | 21/469 |
| 5,051,308 | 9/1991 | Reed et al. | 428/412 |
| 5,156,882 | 10/1992 | Rzad et al. | 427/489 |
| 5,260,096 | 11/1993 | Holzl et al. | 427/215 |
| 5,340,621 | 8/1994 | Matsumoto et al. | 427/561 |
| 5,424,131 | 6/1995 | Wertheimer et al. | 428/413 |
| 5,587,344 | 12/1996 | Ishikawa | 438/786 |
| 5,614,055 | 3/1997 | Fairbairn et al. | 156/345 |
| 5,616,369 | 4/1997 | Williams et al. | 427/536 |
| 5,626,922 | 5/1997 | Miyanaga et al. | 427/535 |
| 5,710,067 | 1/1998 | Foote et al. | 257/632 |
| 5,721,021 | 2/1998 | Tobe et al. | 427/570 |
| 5,897,711 | 4/1999 | Denison | 427/579 |

*Primary Examiner*—Roy V. King
*Attorney, Agent, or Firm*—Stanton C. Braden

[57] ABSTRACT

An improved process for preparing nitrogen containing substrates selected from the group consisting of silicon oxynitride, silicon nitride and titanium nitride films and silicon dioxide cap films characterized by prevent resist contamination when used as dielectric anti-reflective coatings, using a high density plasma CVD system, comprising: providing a processing chamber holding a wafer in a vacuum sufficient to enable $O_2$ to be used as an oxygen source without risk of explosion in a plasma generating region of the processing chamber; introducing a gaseous mixture selected from the group consisting of $SiH_4/O_2/N_2$ or $SiH_4/O_2/N_2/Ar$ into the processing chamber; and subjecting the processing chamber to a RF electrical signal of sufficient frequency to create a high density plasma in the plasma generating region of said processing chamber, whereby said wafer is processed by resulting high density plasma generated by said RF electrical signal.

11 Claims, 3 Drawing Sheets

HIGH DENSITY PLASMA CVD PROCESS FOR MAKING DIELECTRIC ANTI-REFLECTIVE COATINGS

BACKGROUND OF THE INVENTION

1. Field of the Invention

The invention is directed to a process of depositing silicon oxynitride and silicon dioxide in a manner such that these chemically amplified photoresist are not contaminated from amine groups or dangling bonds as a result of using high density plasma(HDP). In general, the invention is accomplished by depositing silicon oxynitride DARC and silicon dioxide using a high density plasma (HDP) CVD system at a lower than usual pressure range and at higher power, thereby permitting the use of $O_2$ gas as an oxygen source of DARC.

2. Description of the Prior Art

Silicon oxynitride DARC, has been broadly used for DUV lithography, and is especially attractive for improving lithographic process windows because of its tunable refractive index and high etch selectivity to resist. Resist contamination is one of the greater concerns in the use or application of silicon oxynitride films; especially due to the presence of amine radicals, which are known to contaminate chemically amplified resists by neutralizing the acid catalyst, and rendering that portion of the resists insoluble in the developer.

The imaging mechanism of chemically amplified photoresist is a photo-acid generator that receives photons from radiation, that generates an acid to catalyze the chemical reaction. This changes the resist solubility that can be removed with the developer. The catalytic acid generated into photo exposure is essential to chemically amplified resist. Any environmental contamination, or other acid depleting process or substrate contamination effects can cause abnormal resist profiles.

Chemically amplified positive resist tend to present themselves as a "foot" over the nitrogen contained substrates, such as silicon oxynitride, silicon nitride, and titanium nitride. The amount of contamination also strongly depends on resist chemistry.

The typical method of preventing the resist contamination from silicon oxynitride is to deposit an additional silicon dioxide and/or plasma treatment to oxidize the surface of silicon oxynitride. In this method, the RF PECVD (plasma enhanced chemical vapor deposition) is operated in a vacuum system, and the pressure range in this system is from 1 torr to 20 torr. Conventional DARC films are deposited at about 1.5 torr 10 torr pressure range. In this pressure range, $O_2$ gas cannot be used because of explosion risk. Therefore, $N_2O$ gas is usually used as an oxygen source of both silicon oxynitride and silicon dioxide. Putting it another way, even though there is an additional silicon dioxide film as a barrier layer, this layer may contain nitrogen and/or an amine group from $N_2O$ reaction gas. Depending upon the sensitivity of the chemically amplified photo resist to nitrogen content in the substrate film, extremely small amounts of amine group or dangling bonds at the surface can cause photoresist contamination, as shown in FIG. 1.

U.S. Pat. No. 5,614,055 disclose a high density plasma CVD and etching reactor. In particular, the plasma reactors of the embodiments of FIGS. 6 and 8 are used in performing any CVD thin film deposition. In col. 10, lines 16–23 it is indicated that these reactors are especially useful for any deposition of films using highly reactive chemical precursor species such as silane. It is further disclosed at this portion of said patent that the reactor can be used for thin films other than silicon dioxide, such as diamond, and that deposition of material having a high dielectric constant can be carried out as well by these embodiments.

The plasma process of the '055 patent is accomplished by: providing a vacuum processing chamber holding a work piece to be processed and having on one side thereof an antenna comprising a substantially dome-shaped portion at least partially surrounding a plasma generating region and a vertical cylindrical portion which underlies said substantially dome-shaped portion; feeding a processing gas including an electronegative gas into said processing chamber; resonantly coupling an RF electrical signal to said antenna; and non-resonantly and inductively coupling electromagnetic energy from said antenna into a plasma formed in said plasma generating region of said processing chamber from said processing gas, whereby said work piece is processed by said plasma.

In the plasma process of the '055 patent, the electronegative gas may comprise a halogen and the processing gas may additionally comprise a precursor gas for silicon dioxide.

A plasma processing method for forming a film by a plasma CVD process is disclosed in U.S. Pat. No. 5,626,922, in which a high density plasma is generated in the presence of a magnetic field.

At column 2, line 63 to column 3, line 15 of the '922 patent, it is indicated that, to generate and maintain a high density plasma at a pressure as high as the range of from 0.03 to 30 torr, an ECR is generated in a columnar space under a low vacuum. Thereafter, a gas, liquid or solid is introduced into the columnar space to produce a plasma which is maintained under high pressure so as to obtain a space having a highly concentrated product gas larger than the gas concentration normally used in a conventional ECR CVD process.

The disclosure in the immediately preceding paragraph indicates that films obtained include carbon films, diamond films, i-carbon, DLC and insulating ceramics, metallic films, and in particular films of metal having a high melting point.

U.S. Pat. No. 5,721,021 discloses a method of depositing titanium-containing conductive thin film using a high density plasma CVD. In particular, a low-pressure high-density plasma is generated with an output of the radio-frequency power of 2.5 kW to deposit a titanium nitride film at a rate of about 30 nm/min. The resultant titanium nitride film has a chlorine content of 1% or less, metallic luster and low resistance.

Accordingly, one significant disadvantage of prior methods of preparing silicon oxynitride DARC is the presence of resist contamination, and this resist contamination remains intact despite the use of additional silicon dioxide and/or plasma treatment to oxidize the surface of silicon oxynitride.

Another disadvantage of the prior art processes of preparing silicon oxynitride DARC is that, when a RF PECVD is utilized, the process must proceed in a vacuum system at a pressure range of from about 1 torr to about 20 torr, most typically, deposition of the DARC films are deposited at a pressure range of from about 1.5 torr 10 torr; however, in this pressure range, $O_2$ gas cannot be used due to the risk of explosion.

A further disadvantage of prior methods of preparing silicon oxynitride DARC is that, since $O_2$ gas cannot be used due to explosion risk, $N_2O$ gas is used as an oxygen source for both silicon oxynitride and silicon dioxide; however, the use of the N$_2$O gas when an additional silicon dioxide film is used as a barrier layer renders the process at risk of containing nitrogen and/or an amine group from the N$_2$O reaction gas. Therefore, depending upon the sensitivity of the chemically amplified photoresist to the nitrogen content in the substrate film, extremely small amounts of the amine group or dangling bonds at the surface tend to cause photoresist contamination, as evidenced by a "foot" over a nitrogen containing substrate, such as silicon oxynitride, silicon nitride, and titanium nitride.

SUMMARY OF THE INVENTION

One object of the present invention is to provide a process for making silicon oxynitride films and silicon dioxide cap film for dielectric, anti-reflective coatings using a high density plasma CVD system.

Another object of the present invention is to provide a process for making silicon oxynitride films for dielectric, anti-reflective coatings using a high density plasma CVD system, in which the chemistry for depositing silicon oxynitride is any ratio of SiH$_4$/O$_2$/N$_2$ or SiH$_4$/O$_2$/N$_2$/Ar.

A further object of the present invention is to provide a process for making silicon oxynitride films and silicon dioxide cap film for dielectric, anti-reflective coatings using a high density plasma CVD system in which the chemistry for depositing the additional barrier layer of silicon dioxide is any ratio of SiH$_4$/O$_2$ or SiH$_4$/O$_2$/Ar.

A further object yet still of the present invention is to provide a process for making silicon oxynitride films and silicon dioxide cap film for dielectric anti-reflective coatings using a high density plasma CVD system, wherein any frequency and any combination of RF powers can be used for source power at a range of between about 50 watts and about 5,000 watts.

A still further object of the present invention is to provide a process for making silicon oxynitride films and silicon dioxide cap film for dielectric anti-reflective coatings using a high density plasma CVD system, wherein any frequency and any combination of RF powers can be used for bias power for Ar sputtering at a range of from 0 watts to about 4,000 watts.

A further object of the present invention is to provide a process for making silicon oxynitride films and silicon dioxide cap film for dielectric anti-reflective coatings using a high density plasma CVD system, wherein pressure in the HDP CVD chamber is disposed between about 0.1 m Torr and about 20 m Torr.

A still further object of the present invention is to provide a process for making silicon oxynitride films and silicon dioxide cap film for dielectric anti-reflective coatings wherein the SiH$_4$ flow rate during the deposition process many range from between about 1 sccm and about 500 sccm, and the O$_2$ flow rate during deposition may also range from between about 1 sccm and about 500 sccm.

A further object yet still of the present invention is to provide a process for making silicon oxynitride films and silicon dioxide cap film for dielectric anti-reflective coatings using a high density plasma CVD system wherein the Ar flow rate during deposition may range from between about 0 sccm to about 500 sccm; the He gas may be used for backside cooling at a range of from about 0 torr to about 30 torr; and the electrostatic chuck power may range from between 0 V and 2,000 V.

In general the invention is accomplished by depositing silicon oxynitride DARC and silicon dioxide using a high density plasma (HDP) CVD system at lower pressure ranges and higher power that permit the use of O$_2$ gas as an oxygen source of DARC. The HDP CVD process uses at least two different powers for source plasma generation for the deposition portion and bias power for the sputtering portion using Ar gas. The process is operated at a few mtorr range, thereby allowing the use of O$_2$ gas with SiH$_4$ gas. This provides a high quality of films because of its lower pressure range, higher power, and in-situ sputtering. Silicon oxynitride is deposited using SiH$_4$/O$_2$/N$_2$ and silicon dioxide for an additional barrier layer is deposited using SiH$_4$/O$_2$, which does not contain a nitrogen component. The chemically amplified photo- resist prepared in accordance with the invention process does not produce any contamination from HDP oxide film.

BRIEF DESCRIPTION OF THE DRAWINGS

FIG. 1$e$ depicts silicon oxynitride plus cap oxynitride at 320A after 120W plasma treat; and FIG. 1$f$ depicts silicon oxynitride plus oxynitride at 320A after 1 kW plasma treat.

DETAILED DESCRIPTION OF THE INVENTION

Figure 1A:
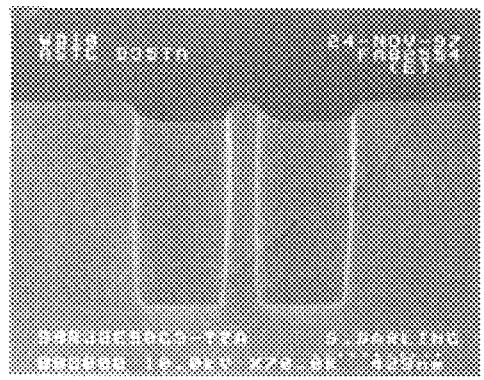
FIG. 1 in general is a photo of a photoresist profile showing "footing" or contamination on silicon oxynitride DARC layers, wherein, specifically,1$a$ depicts no cap and plasma; 1$b$ depicts silicon oxynitride plus cap oxide at 100A; 1$c$ depicts silicon oxynitride plus cap oxide at 200A; 1$d$ depicts silicon oxynitride plus cap oxide at 320A.
Figure 1B:
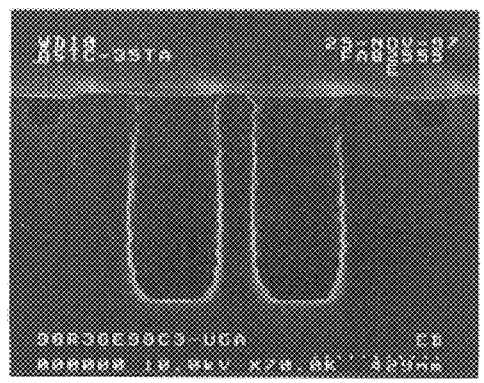
Figure 1C:
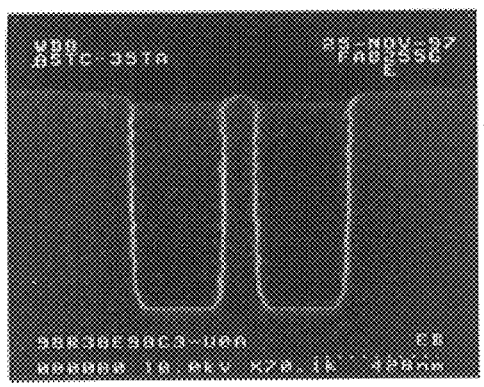
Figure 1D:
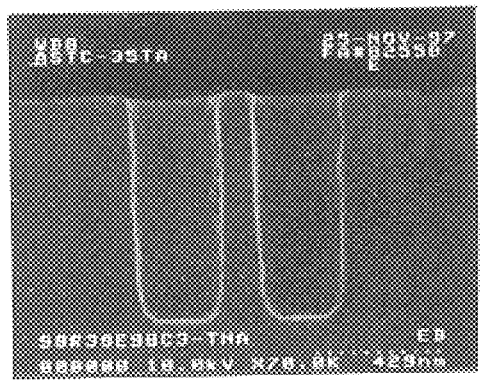
Figure 1E:
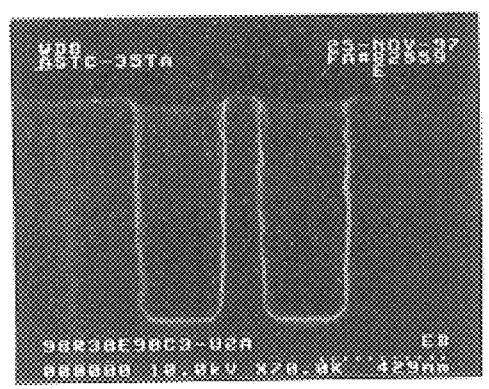
Figure 1F:
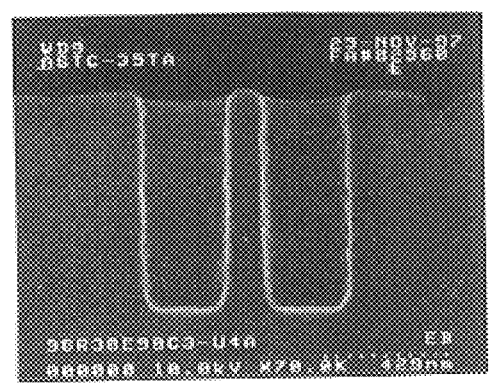

The invention deposits silicon oxynitride DARC and silicon dioxide using high density plasma (HDP) CVD at lower pressure ranges and higher power ranges,thereby permitting the use of O$_2$ gas as an oxygen source of DARC.

The HDP CVD process of the invention uses at least two different powers for source plasma generation for the deposition portion or in the bias power for sputtering using Ar gas. By operating at a few mtorr ranges, the invention process allows the use of O$_2$ gas along with SiH$_4$ gas. The HDP CVD process of the invention also provides high quality films due to its use of lower pressure ranges, higher power ranges and in-situ sputtering.

In the invention process, silicon oxynitride is deposited by using any ratio of SiH$_4$/O$_2$/N$_2$ or SiH$_4$/O$_2$/N$_2$/Ar and silicon dioxide is deposited as an additional barrier layer by using any ratio of SiH$_4$/O$_2$ or SiH$_4$/O$_2$/Ar, which does not contain a nitrogen component. As a result of the invention process, the chemically amplified photoresist does not incur any contamination from the HDP oxide film.

A significant feature of the invention process is that HDP silicon oxynitride can be used without a silicon dioxide cap layer since it is denser and cleaner film than conventional PECVD film.

EXAMPLE

In a vacuum reactor chamber, silicon oxynitride DARC and silicon dioxide are deposited using a high density plasma (HDP) CVD process, and any frequency and any combination of RF powers is used for source power at a range of between 50 watts and about 5,000 watts and at low pressure ranges in the vacuum chamber of between about 0.1 mtorr and about 20 mtorr. The bias power for Ar sputtering is between the range of 0 watts and about 4,000 watts, and $O_2$ gas is used as an oxygen source of DARC. The $O_2$ gas flow rate during deposition is between about 1 sccm and about 500 sccm, and the $N_2$ flow rate during deposition is between about 0 sccm and about 500 sccm.

In one embodiment of the invention, when silicon oxynitride is deposited, use is made of $SiH_4/O_2/N_2$ chemistry, and the high density plasma (HDP) silicon oxynitride film obtained is denser and cleaner film then conventional film. This is very positive, since the HDP silicon oxynitride can be used without a silicon dioxide cap layer.

However, when the silicon oxynitride is deposited using the $SiH_4/O_2/N_2$ mixture, silicon dioxide may be used as an additional barrier layer by depositing $SiH_4/O_2$, which does not contain a nitrogen component.

FIG. 1 in general is a photo of a photoresist profile showing "footing" or contamination on silicon oxynitride DARC layers, wherein, specifically, 1a depicts no cap and plasma; 1b depicts silicon oxynitride plus cap oxide at 100A; 1c depicts silicon oxynitride plus cap oxide at 200A; 1d depicts silicon oxynitride plus cap oxide at 320A; FIG. 1e depicts silicon oxynitride plus cap oxynitride at 320A after 120W plasma treat; and FIG. 1f depicts silicon oxynitride plus oxynitride at 320A after 1 kW plasma treat.

Figure 2:
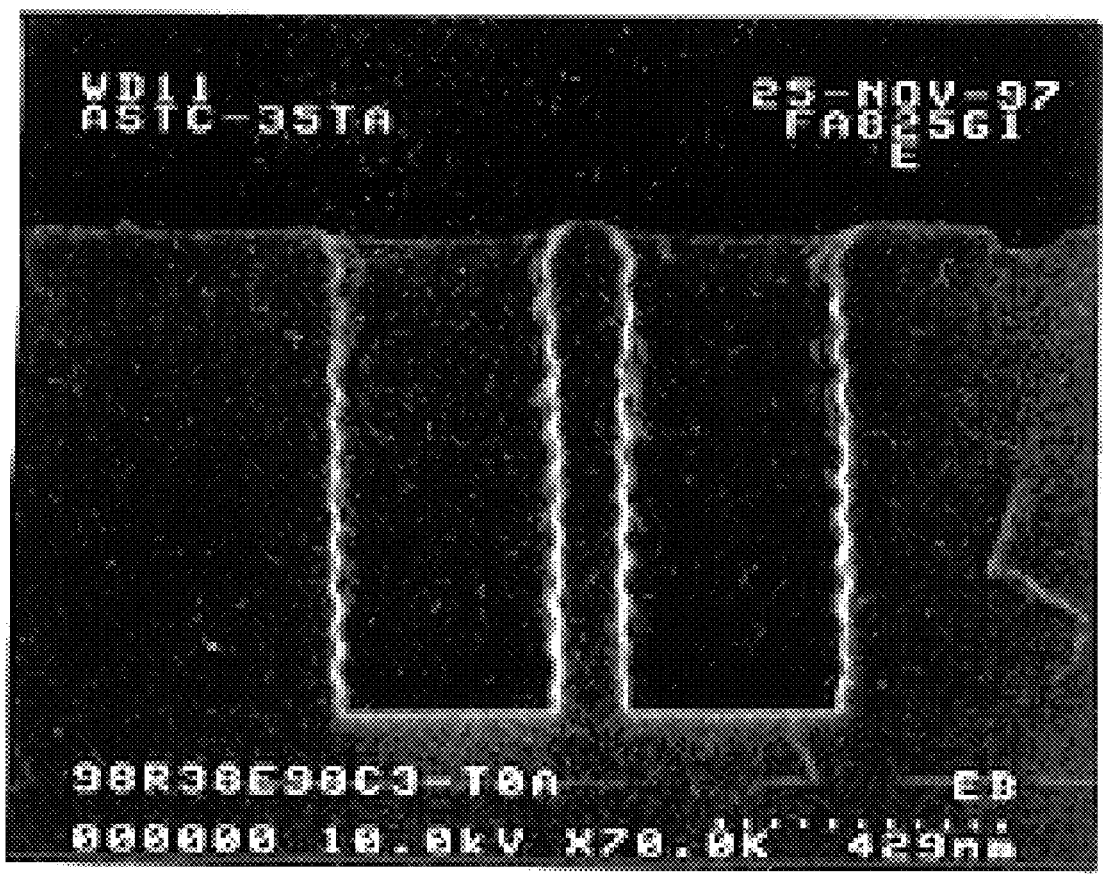
FIG. 2 is a photo of a chemically amplified photoresist prepared according to the invention process, wherein there is no contamination from HDP oxide film,as shown by no "footing".

FIG. 2 is a photo of a chemically amplified photoresist prepared according to the invention process, wherein there is no contamination from HDP oxide film at 800A, as shown by no "footing".

I claim:

1. A process for preparing nitrogen containing films selected form the group consisting of silicon oxynitride and silicon nitride characterized by prevent resist contamination when used as dielectric anti-reflective coatings, using a high density plasma CVD system, comprising:

providing a processing chamber holding a wafer in a vacuum of from about 0.1 mTorr to about 20 mTorr to enable $O_2$ to be used as an oxygen source without risk of explosion in a plasma generating region of said processing chamber;

introducing a gaseous mixture selected form the group consisting of $SiH_4/O_2/N_2$ or $SiH_4/O_2/N_2/Ar$ into the processing chamber; and subjecting the processing chamber to RF electrical signal of sufficient frequency to create a high density plasma in the plasma generating region of said processing chamber, whereby said wager is processed by resulting high density plasma generated by said RF electrical signal.

2. The process of claim 1 wherein said film is silicon oxynitride and said gaseous mixture is $SiH_4/O_2/N_2$.

3. The process of claim 1 wherein said film is silicon oxynitride and said gaseous mixture is $SiH_4/O_2/N_2/Ar$.

4. A process for preparing silicon dioxide cap films characterized by prevent resist contamination when used as dielectric anti-reflective coatings, using high-density plasma CVD system, comprising;

providing a processing chamber holding a wafer in a vacuum of from about 0.1 mTorr to about 20 mTorr to enable $O_2$ to be used as an oxygen source without risk of explosion in a plasma generating region of said processing chamber;

producing a gaseous mixture selected from the group consisting of $SiH_4/O_2$ or $SiH_4/O_2/Ar$;

subjecting the processing chamber to a RF electrical signal of sufficient frequency to create a high density plasma in the plasma generating region of said processing chamber, whereby said wafer is processed by resulting high density plasma generated by said RF electrical signal.

5. The process of claim 4 wherein said gaseous mixture is $SiH_4/O_2$.

6. The process of claim 4 wherein said gaseous mixture is $SiH_4/O_2/Ar$.

7. The process of claim 2 wherein the $SiH_4$ component of the gaseous mixture is introduced at a flow rate of between about 1 sccm to about 500 sccm.

8. The process of claim 3 wherein the $SiH_4$ component of the gaseous mixture is introduced at a flow rate of between about 1 sccm to about 500 sccm.

9. The process of claim 8 wherein an Ar sputtering component is introduced at a flow rate of between about 0 sccm to about 500 sccm.

10. The process of claim 5 wherein the $SiH_4$ component of the gaseous mixture is introduced at a flow rate of between about 1 sccm to about 500 sccm.

11. The process of claim 6 wherein an Ar sputtering component is introduced at a flow rate of between about 0 sccm to about 500 sccm.

* * * * *